Nov. 3, 1970 N. R. LEVESQUE ET AL 3,538,389

SUBELEMENT FOR ELECTRONIC CIRCUIT BOARD

Filed Feb. 24, 1969 2 Sheets-Sheet 1

INVENTORS.
Norman R. Levesque
Donald E. Harper
By Kemp and Beech
Keith D. Beecher
ATTORNEYS

SUBELEMENT FOR ELECTRONIC CIRCUIT BOARD

Filed Feb. 24, 1969 2 Sheets-Sheet 2

INVENTORS:
Norman R. Levesque
Donald E. Harper
Dering and Beecher
By Keith D. Beecher
ATTORNEYS United States Patent Office 3,538,389
Patented Nov. 3, 1970

3,538,389
SUBELEMENT FOR ELECTRONIC CIRCUIT BOARD
Norman R. Levesque and Donald E. Harper, both of 652 E. 97th St., Apt. 3, Inglewood, Calif. 90301
Filed Feb. 24, 1969, Ser. No. 801,542
Int. Cl. H05k 1/16, 7/06
U.S. Cl. 317—101 9 Claims

ABSTRACT OF THE DISCLOSURE

A subelement is provided for an electronic circuit board, and which also has application in the field of fluidics and other areas. The subelement of the invention is in the form of a thin epoxy or plastic strip, having a basic circuit formed thereon by printed circuit techniques. In the practice of the present invention, complete electronic circuits are formed by mounting the individual subelements of selected types on a larger circuit board and in a selected pattern. The circuitry on the subelements may then be interconnected by circuit components, wire jumpers, or conductive tape, or by any other appropriate means. To assist in the mounting of the subelements, the thin strips may be backed with a pressure sensitive or other type of adhesive, so that the subelements may be quickly and easily attached to the supporting board.

BACKGROUND OF THE INVENTION

In the construction of a usual prior art electronic circuit board, a rigid or flexible board is provided which is formed, for example, of plastic, epoxy, fiberboard, metal, ceramic, or other appropriate material. The required electronic circuit is then formed on the circuit board by any one of a variety of known printed circuit techniques.

In the practice of the present invention, however, individual subelements are provided in the form of thin strips of copper clad epoxy or plastic circuit board material. These subelements are easily handled, and they may be conveniently mounted on a larger supporting board. Entire circuits, as well as individual circuit components, or element mounting or connection patterns, are formed on the individual subelement strips of the invention. The subelements are then selected as needed, and mounted on the larger boards in selected patterns to form any desired complete electronic circuit configuration. Interconnections between the subelements on the supporting board may be made in a variety of ways, such as adhesive-backed electrically conductive tape, or by prepunched or die-cut conductors of selected shapes, or by insulated or bare wire jumpers; as well as by integrated circuits, transistors, resistors, capacitors, or other usual circuit components.

As mentioned above, the subelements of the present invention may be mounted on the larger boards by the use, for example, of backings of pressure-sensitive adhesives; or by thermally applied adhesives or thermal settings adhesives. In some applications, the adhesive backing to the individual substrates or thin strips of the subelements may be applied at the time of their manufacture, so that the subelements may be conveniently mounted on the larger boards, for example, by the application of pressure or heat. In other applications, the adhesive backing may be applied to the individual strips of the subelements at the time the subelements are mounted on the larger boards.

Specifically, when the adhesive backing is applied to the subelement strips at the time of their manufacture, this adhesive may be of the pressure-sensitive type, so that the individual subelements may be applied to the mounting board, as required, merely by the application of pressure and at room temperature. The same technique may be used to apply heat-sensitive adhesive at the time of manufacture of the individual subelement substrates, so that each substrate has a backing of heat-sensitive adhesive.

These latter substrates may be applied to the mounting board by the application of heat which causes such adhesives to become tacky. Then, when the substrates are pressed against the mounting board and their adhesive backing allowed to cure, a permanent bond is created. It will be understood, of course, that the elements may be attached to the mounting board by the use of any of the many types of present day commercially available adhesives, or by any other appropriate means.

The larger mounting boards for the subelements of the present invention may have the composition of the usual prior art circuit boards, as enunciated above. Moreover, the larger mounting boards may be undrilled, or they may be pre-drilled to provide various grid patterns, as is known to the art; or to provide holes matching similar hole patterns in the subelement substrates.

The concept of the present invention is advantageous in that any required electronic circuit may be synthesized easily and simply on the mounting board, merely by affixing various electric subelements onto the board in a selected pattern, and by then mounting the circuit components and interconnecting conductors on the board in electrical contact with the circuits on the individual subelements. Cost savings can be realized by such a construction, especially in the areas of design packaging, assembly, testing and modification of the electronic circuit.

The use of the concept of the invention results in space savings, and in more reliable electronic circuit boards than those produced by present day prototype methods. Moreover, the required circuits are easier to assemble on the circuit boards when the subelements of the invention are used, as compared with the prototype method in which conventional circuit boards must be individually designed, or where components are suspended mechanically above the circuit board with non-permanent prototype thermal methods. The aforesaid factors serve to reduce the design and assembly time on production and pre-production models, when the teachings of the invention are applied, as compared with the usual prior art prototype approach.

The end product is also more durable when the subelement method of the present invention is used, as compared with the usual prior art circuit board. Assemblies constructed in accordance with the concepts of the invention are able to withstand harsh environments, including extreme temperature variations, vibrations, radiation, moisture, salt spray, fungus, and other contaminants, better than other prototype assemblies.

Another important aspect of the invention is that changes and modifications in existing electronic circuits may be made more easily when the subelement concept of the present invention is applied, as compared with the usual prior art circuit board. This is because such changes may be made merely by adding or replacing one or more subelement in the circuit board.

DETAILED DESCRIPTION OF THE ILLUSTRATED EMBODIMENTS

Figure 1:
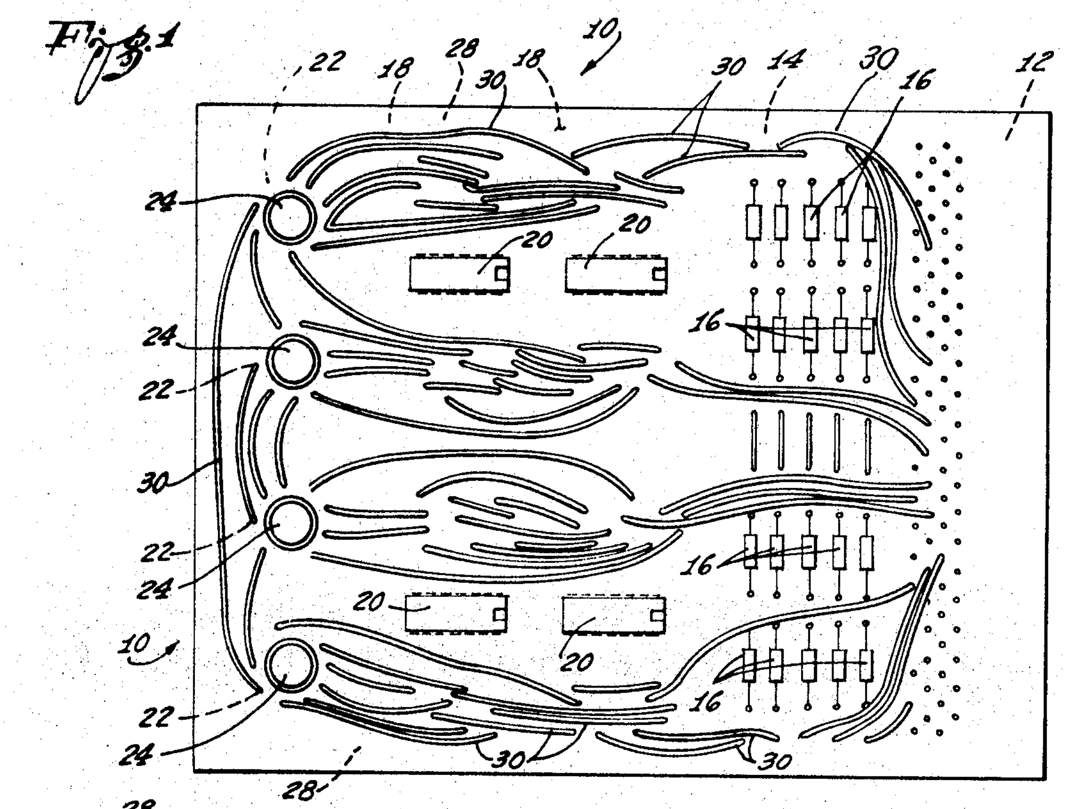
FIG. 1 is a top plan view of a typical printed circuit board incorporating the concepts of the invention.
Figure 2:
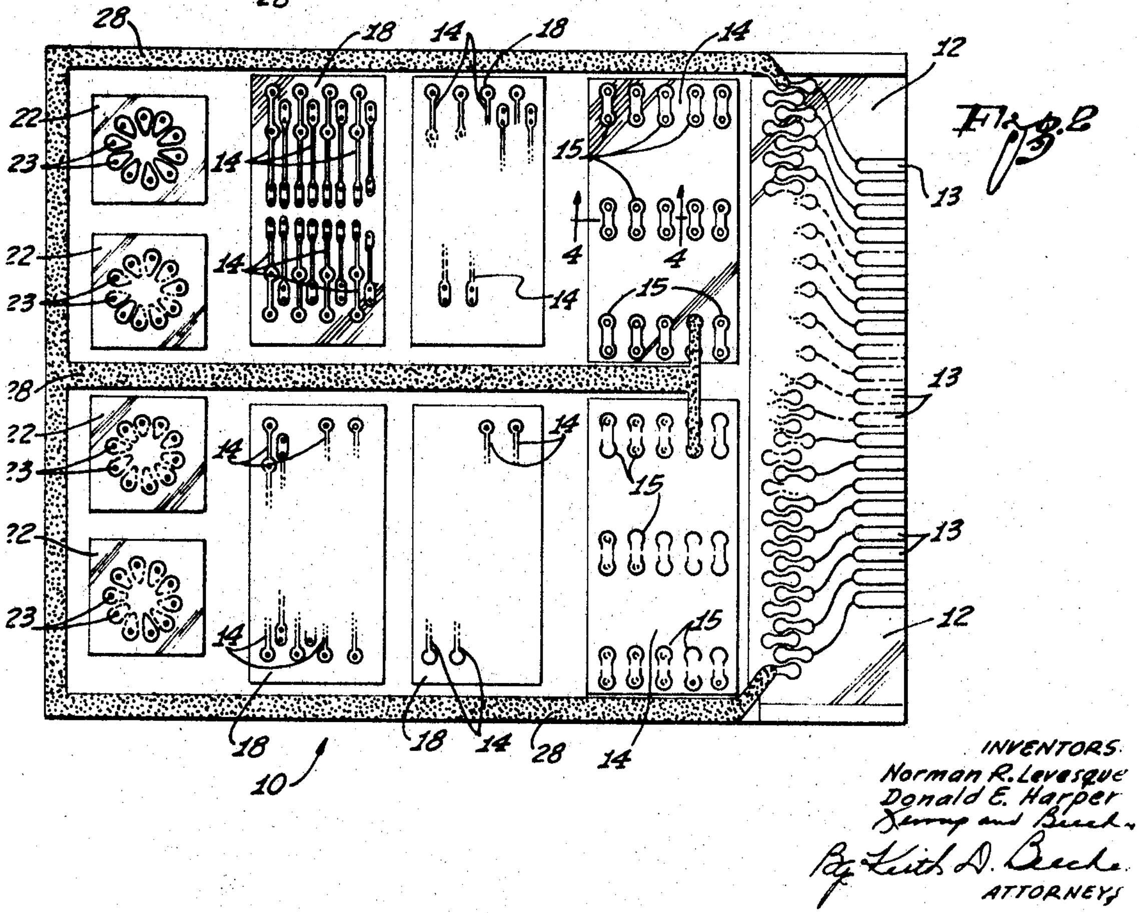
FIG. 2 is a bottom view of the board of FIG. 1.

As shown in FIGS. 1 and 2, a mounting board 10 for the illustrated electronic circuit is provided. The board 10, as mentioned above, may be either rigid or flexible, and it may be formed of any appropriate plastic, epoxy, fiberboard, metal, ceramic, or other suitable material.

Figure 3A:
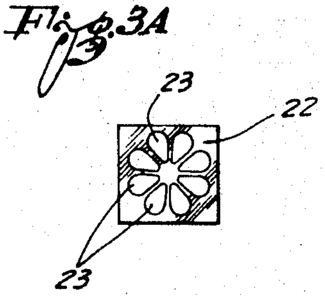
FIGS. 3A–3D are top plan views of different types of subelements, each incorporating the principles of the present invention.

The electrical circuitry on the board 10 is made up of different subelements, each incorporating the concepts of the present invention. For example, on one end of the board 10 is a subelement 12 which is also shown in FIG. 3D. The subelement 12 comprises a thin strip of appropriate insulating material, and which is adhesively attached to the board 10, and extends across the board at one end thereof. The electrical circuitry on the subelement 12 formed by usual printed circuit techniques, and the circuitry constitutes end connections or terminals 13 for the electronic circuit on the board 10, so that the board may be plugged into a suitable receptacle in appropriate electronic equipment.

The subelement 12, as well as the other subelements to be described, may be adhesively backed, as mentioned above, by pressure sensitive or heat sensitive material, so that it can conveniently be mounted on the supporting board 10. Alternately, the subelement 12 may be mounted on the board by adhesive, or other means, applied during the mounting process.

A second subelement 14 (FIG. 3C) is also mounted on the board 10, the subelement 14 including an electric circuitry formed by a plurality of printed circuit conductors 15. The printed circuit conductors 14 on the subelement 14 constitute connectors for a plurality of resistors 16 which are supported on the opposite side of the board 10, as shown in FIG. 1, from the subelement 14.

Figure 3B:
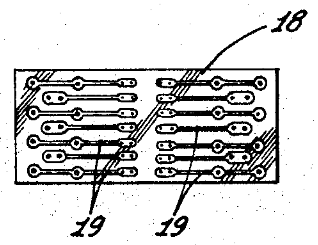

Likewise, a pair of further subelements 18 is mounted on the underside of the board 10, as shown in FIG. 2, these latter subelements being generally of the form shown in FIG. 3B. The printed circuit conductors 19 on the subelements 18 are used as connectors for various integrated circuit components 20 which, like the resistors 16, are mounted on the top side of the board, as shown in FIG. 1.

Finally, a plurality of additional subelements, designated 22, and which are shown in more detail in FIG. 3A, are also mounted on the underside of the board 10, and these latter elements form mounting components and connectors 23 for individual transistors 24.

As shown in FIGS. 1 and 2, the circuitry on the different subelements may be interconnected by conductive pressure sensitive tapes 28 extending along the underside of the board, as shown in FIG. 2, or by wire jumpers 30 connected between the circuitry on the subelements, and extending across the upper side of the board as shown in FIG. 1. The electrically conductive tape, for example, may be of the type described in Giellerup Pat. 3,132,204, or in Kilduff et al. Pat. 3,335,545.

Figure 4:
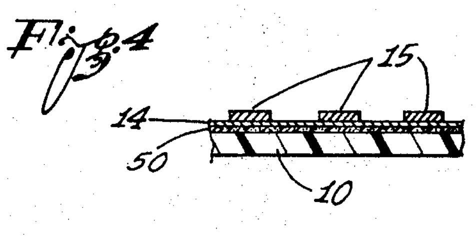
FIGS. 4 and 5 are sectional views, taken respectively along the lines 4—4 of FIG. 2, and 5–5 of FIG. 3.
Figures 3C, 5:
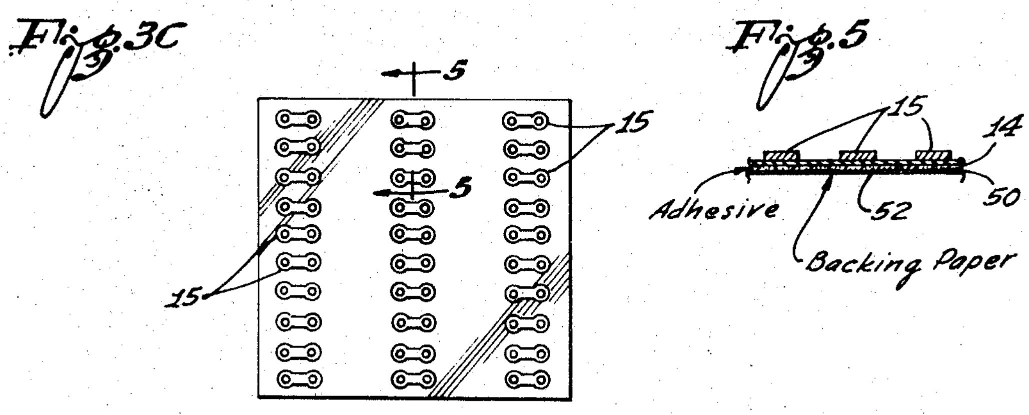
Figure 3D:
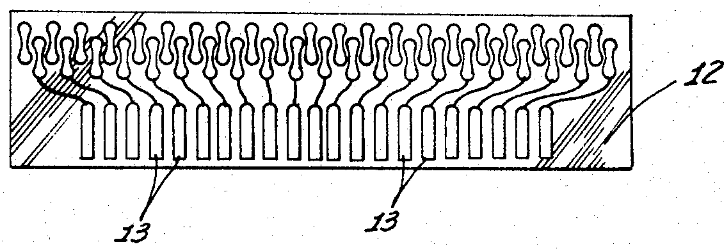

As particularly shown in the sectional views of FIGS. 4 and 5, and as described above, each of the subelements, like the subelement 14, may be formed of a thin strip of insulating material such as epoxy glass; and the strips are attached to the board 10 by a pressure and/or temperature sensitive adhesive or other suitable adhesive 50, which forms a backing for the strips. The adhesive backing 50 may normally be covered by a release, or backing, paper 52 (FIG. 5). The strips themselves may be formed of epoxy impregnated glass cloth, for example, to preclude the need for a separate adhesive layer.

The invention provides, therefore, an electronic circuit board which is simple to assemble, in that a plurality of different types of subelments may be provided, it being pointed out that the various types illustrated in FIGS. 3A–3D are merely illustrative, and many other circuit configurations may be provided.

By applying the teaching of the present invention, any desired electronic circuit may be synthesized, merely by selecting the various required subelements, and affixing the subelements to the mounting board. Then, the interconnections between the subelements may be provided, as suggested above, by means of wire jumpers or conductive adhesive tape, as well as the usual transistor, integrated circuit, resistor, and other circuit components.

What is claimed is:

1. A subelement bearing a predetermined circuit design for an electronic circuit board, or the like, and to be adhesively affixed to a surface of such board in a predetermined location on said surface with respect to like subelements thereon containing similar or dissimilar circuit designs, said subelement comprising: a thin electrically insulating strip of material selected from a group consisting of plastic, epoxy, fiberboard, metal or ceramic, a plurality of distinct electrically conductive elements formed on one face of said strip and spaced from one another in mutually insulating relationship so as to constitute the aforesaid circuit design, and an adhesive formed on the other face of said strip to permit said strip to be readily attached to the aforesaid circuit board on said predetermined location thereon and in a predetermined relationship on said surface with respect to the aforesaid like subelements.

2. The subelement defined in claim 1, in which said strip is formed of epoxy glass material, and said electrically conductive elements are formed of copper clad to said strip.

3. The subelement defined in claim 1, in which said adhesive is a pressure-sensitive type.

4. The subelement defined in claim 1, and which includes a strip of release paper forming a backing for said adhesive.

5. The subelement defined in claim 1, in which said electrically conductive elements constitute a mounting pattern for an electrical circuit component.

6. The subelement defined in claim 1, in which said electrically conductive elements constitute terminal conductors.

7. In combination: an electronic circuit board and a plurality of subelements each bearing predetermined similar or dissimilar electric circuit designs adhesively affixed to a surface of said circuit board at predetermined locations on said surface with respect to one another, said subelements each comprising a thin electrically insulating strip formed of a material selected from a group of materials consisting of plastic, epoxy, fiberboard, metal or ceramic, and having a plurality of distinct electrically conductive elements formed on one face thereof and spaced from one another in mutually insulating relationship so as to constitute the aforesaid circuit design, and an adhesive formed on the other face of said strip to permit the aforesaid strips to be readily attached to said surface of said circuit board at predetermined locations on said surface with respect to one another.

8. The combination defined in claim 7, in which said strips are formed of epoxy glass material, and said electrically conductive elements on each of said strips are formed of copper clad to said strips.

9. The combination defined in claim 7, in which said adhesive on each of said strips is a pressure-sensitive adhesive.

References Cited

UNITED STATES PATENTS

| | | | |
|---|---|---|---|
| 2,808,352 | 10/1957 | Coleman et al. | 117—227 |
| 2,956,703 | 10/1960 | Royal | 156—249 XR |
| 3,013,918 | 12/1961 | Betham | 156—249 XR |
| 3,279,969 | 10/1966 | Borchardt | 156—249 XR |
| 3,324,014 | 6/1967 | Modjeska | 29—625 |
| 3,396,459 | 8/1968 | Freehauf | 29—625 |
| 3,405,025 | 10/1968 | Goldman | 161—185 XR |
| 3,413,716 | 12/1968 | Schwertz et al. | 29—625 XR |
| 3,007,997 | 11/1961 | Panariti. | |
| 3,019,283 | 1/1962 | Little. | |
| 3,039,177 | 6/1962 | Burdett. | |
| 3,339,008 | 8/1967 | MacArthur et al. | 174—68.5 |
| 3,456,335 | 7/1969 | Hennings et al. | 29—625 |
| 3,473,992 | 10/1969 | Martello et al. | 29—625 XR |

OTHER REFERENCES

Rules of Practice, U.S. Patent Office, pp. 139 and 141, Material notation.

ROBERT K. SCHAEFER, Primary Examiner

J. R. SCOTT, Assistant Examiner

U.S. Cl. X.R.

29—625; 174—68.5; 156—249